United States Patent
Happ et al.

(10) Patent No.: US 7,327,623 B2
(45) Date of Patent: Feb. 5, 2008

(54) ENERGY ADJUSTED WRITE PULSES IN PHASE-CHANGE MEMORIES

(75) Inventors: Thomas Happ, Pleasantville, NY (US); Zaidi Shoaib, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/524,131

(22) Filed: Sep. 20, 2006

(65) Prior Publication Data

US 2007/0014173 A1 Jan. 18, 2007

Related U.S. Application Data

(62) Division of application No. 10/995,643, filed on Nov. 23, 2004, now Pat. No. 7,113,424.

(51) Int. Cl.
  G11C 7/04 (2006.01)
(52) U.S. Cl. .................. 365/211; 365/163; 365/189.11
(58) Field of Classification Search ................ 365/221, 365/163, 189.11
  See application file for complete search history.

(56) References Cited

U.S. PATENT DOCUMENTS

| | | | |
|---|---|---|---|
| 6,625,054 B2 | 9/2003 | Lowrey et al. | |
| 6,673,648 B2 | 1/2004 | Lowrey | |
| 6,735,546 B2 | 5/2004 | Scheuerlein | |
| 6,791,107 B2 | 9/2004 | Gill et al. | |
| 6,928,022 B2 * | 8/2005 | Cho et al. ................. | 365/225.7 |
| 7,259,982 B2 * | 8/2007 | Johnson ...................... | 365/163 |
| 2005/0117388 A1 | 6/2005 | Cho et al. | |

OTHER PUBLICATIONS

Ha, Y. H. et al., "An Edge Contact Type Cell for Phase Change RAM Featuring Very Low Power Consumption," Symposium on VLSI Technology Digest of Technical Papers, pp. 2, (2003).
Horii, H. et al., "A Novel Cell Technology Using N-Doped GeSbTe Films for Phase Change RAM," Symposium on VLSI Technology Digest of Technical Papers, pp. 2, (2003).
Hwang, Y.N. et al., "Full Integration and Reliability Evaluation of Phase-Change RAM Based on 0.24μm-CMOS Technologies," pp. 2, (2003).
Lai, Stefan et al., "OUM-A 180 nm Nonvolatile Memory Cell Element Technology for Stand Alone and Embedded Applications," IEDM Technical Digest, Session 36.5, pp. 4, (2001).
Pellizzer, F. et al., "Novel μTrench Phase-Change Memory Cell for Embedded and Stand-Alone Non-Volatile Memory Applications," VLSI Technology Digest of Technical Papers, pp. 2, (2004).

* cited by examiner

Primary Examiner—Anh Phung
Assistant Examiner—Pho M. Luu
(74) Attorney, Agent, or Firm—Dicke, Billig & Czaja, PLLC

(57) ABSTRACT

A memory cell device that includes a plurality of phase-change memory cells, at least one write pulse generator, and at least one temperature sensor. The plurality of phase-change memory cells are each capable of defining at least two states. The write pulse generator generates a write pulse for the plurality of phase-change memory cells. The temperature sensor is capable of sensing temperature. The write pulse generator adjusts the write pulse for the plurality of phase-change memory cells with the temperature sensed by the temperature sensor.

20 Claims, 3 Drawing Sheets though the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

ENERGY ADJUSTED WRITE PULSES IN PHASE-CHANGE MEMORIES

CROSS-REFERENCE TO RELATED APPLICATIONS

This Divisional application claims the benefit of Utility patent application Ser. No. 10/995,643, filed on Nov. 23, 2004, now U.S. Pat. No. 7,113,424, issued on Sep. 26, 2006, and which is herein incorporated by reference.

BACKGROUND

The present invention relates to phase-change memories. In particular, a system and method of operation are provided for the phase-change memory cells using an adjusted power heating pulse to avoid under- and over-heating. Phase-change materials may exhibit at least two different states. Consequently, phase-change material may be used in a memory cell to store a bit of data. The states of a phase change material may be referred to as amorphous and crystalline states. These states may be distinguished because the amorphous state generally exhibits higher resistivity than does the crystalline state. Generally, the amorphous state involves a more disordered atomic structure, while the crystalline state features an ordered lattice.

Phase change in the phase-change materials may be induced reversibly. In this way, the memory may change from the amorphous to the crystalline state, and vise versa, in response to temperature changes. The temperature changes to the phase-change material may be effectuated in a variety of ways. For example, a laser can be directed to the phase-change material, current may be driven through the phase change material, or current or voltage can be fed through a resistive heater adjacent the phase change material. With any of these methods, controllably heating the phase-change material causes controllable phase change with the phase-change material.

When a phase-change memory comprises a memory array having a plurality of memory cells that are made of phase-change memory material, the memory may be programmed to store data utilizing the memory states of the phase-change material. One way to read and write data in such a phase-change memory device is to control a current (or a voltage) that is directed through the phase-change material, or through a heater adjacent to it. Since the switching in such memory cells depends on the exact temperature of the phase-change memory material, it is necessary to control temperature within each memory cell, independent of ambient conditions. For these and other reasons, there is a need for the present invention.

SUMMARY

One aspect of the present invention provides a memory cell device including a plurality of phase-change memory cells, at least one write pulse generator, and at least one temperature sensor. The plurality of phase-change memory cells are each capable of defining at least two states. The write pulse generator generates a write pulse for the plurality of phase-change memory cells. The temperature sensor is capable of sensing temperature. The write pulse generator adjusts the write pulse for the plurality of phase-change memory cells in accordance with the temperature sensed by the temperature sensor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
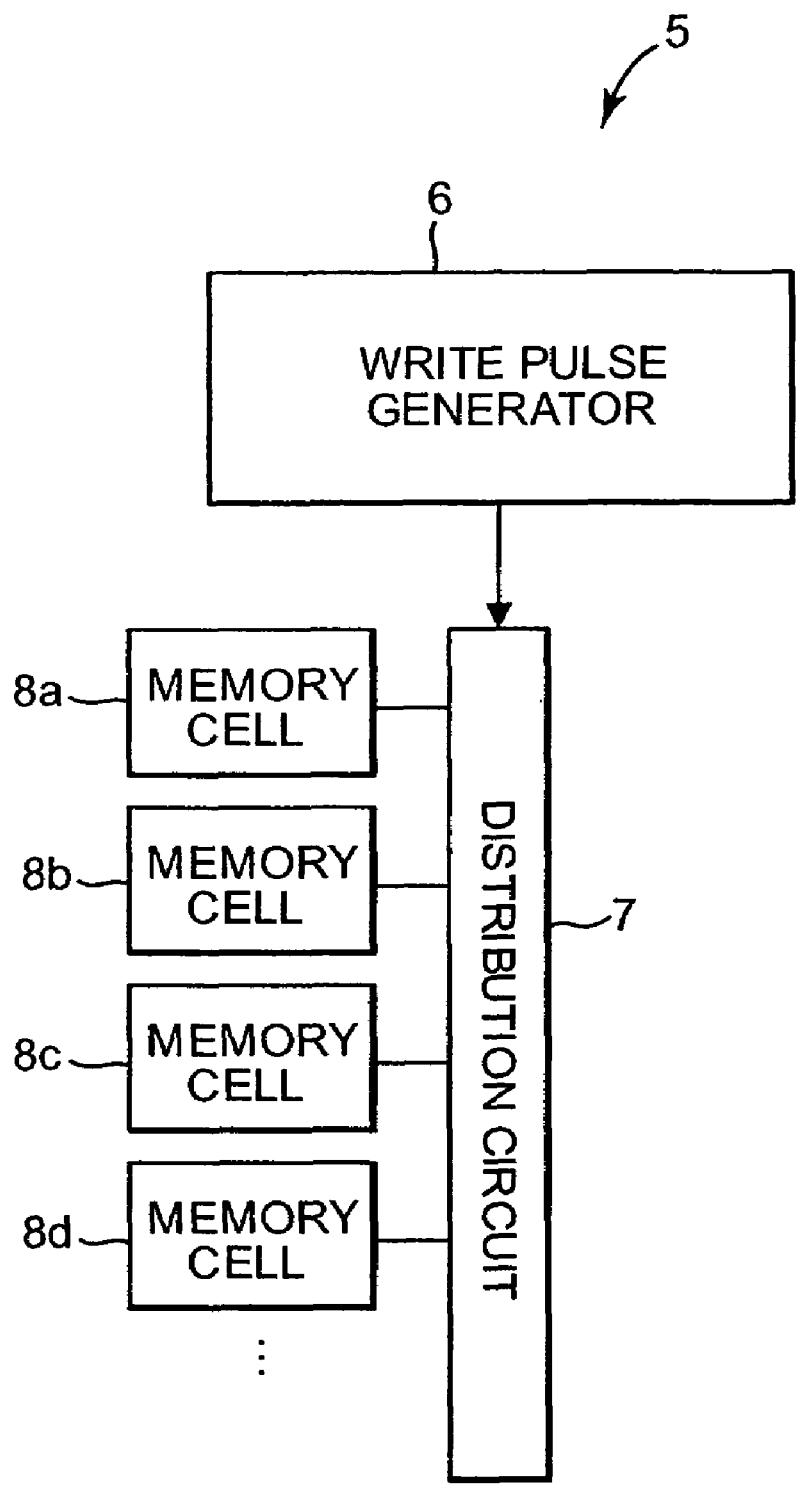
FIG. 1 illustrates a block diagram of a memory cell device.

FIG. 1 illustrates a block diagram of a memory cell device 5. Memory cell device 5 includes write pulse generator 6, distribution circuit 7, and memory cells 8a, 8b, 8c, and 8d. In one embodiment, memory cells 8a-8d are phase-change memories that are based on amorphous to crystalline phase transition. The phase change between amorphous and crystalline may be induced reversibly. Thus, in response to controlled changes in temperature, the memory cells 8a-8d may change from the amorphous to the crystalline state and may revert back to the amorphous state thereafter, or visa versa.

In one embodiment, write pulse generator 6 generates current or voltage pulses that are controllably directed to memory cells 8a-8d via distribution circuit 7. In one embodiment, distribution circuit 7 is a plurality of transistors that controllably direct current or voltage pulses to the memory and in another, is a plurality of transistors that controllably direct current or voltage pulses to heaters adjacent to the memory.

In one embodiment, memory cells 8a-8d are made of phase-change materials that may be changed from amorphous state to crystalline state or crystalline state to amorphous state under the influence of temperature change. The amorphous and crystalline states thereby define two bit states for storing data within memory cell device 5. The two bit states of memory cells 8a-8d differ significantly in their electrical resistivity. In the amorphous state, the phase-change materials will exhibit significantly higher resistivity than they will in the crystalline state. In this way, by reading the cell resistance, the bit value assigned to a particular memory cell can be determined.

In order to program a memory cell 8a-8d within memory cell device 5, write pulse generator 6 generates a current or voltage pulse for heating the phase-change material in the target memory cell. In one embodiment, write pulse generator 6 generates an appropriate current or voltage pulse and distribution circuit 7 distributes the pulse to the appropriate target memory cell 8a-8d. The current or voltage pulse amplitude and duration is controlled depending on whether the memory cell is being set or reset. Generally, a "set" of a memory cell is heating the phase-change material of the target memory cell above its crystallization temperature (but below its melting temperature) long enough to achieve the crystallized state. Generally, a "reset" of a memory cell is quickly heating the phase-change material of the target memory cell above its melting temperature, and then quickly quench cooling the material, thereby achieving the amorphous state.

In order to reach the target melting temperature required to reset a memory cell, a relatively high amplitude current or voltage pulse of short duration is sent from write pulse generator 6 to the target memory cell 8a-8d causing the phase-change material to melt and amorphize during the subsequent quench cooling. In order to reach the target crystallization temperature to set a memory cell, a relatively lower amplitude current or voltage pulse of relatively longer duration is sent from write pulse generator 6 to the target memory cell 8a-8d thereby heating up the phase-change material over its crystallization temperature lowering its resistance.

In this way, two states are defined for each memory cell. In the reset state a high current or voltage pulse melts the phase-change material thereby amorphizing the material and creating a high resistivity. In the set state a relatively lower current or voltage pulse is sent through the phase-change material raising the temperature sufficiently to crystallize the phase change material lowering its resistivity.

Figure 2:
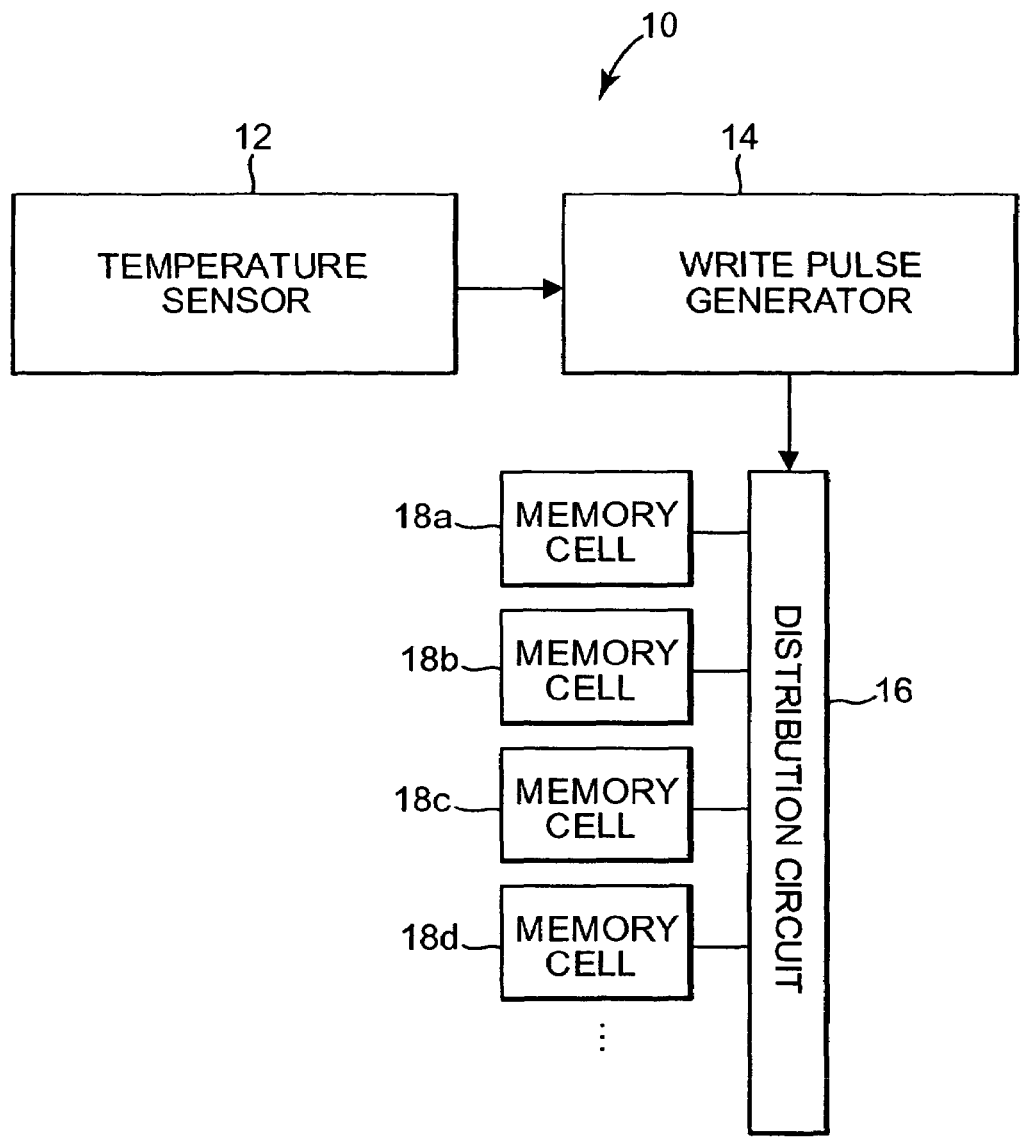
FIG. 2 illustrates a block diagram of a memory cell device in accordance with one embodiment of the present invention.

FIG. 2 illustrates memory cell device 10 in accordance with one embodiment of the present invention. Memory cell device 10 includes temperature sensor 12, write pulse generator 14, distribution circuit 16 and memory cells 18a, 18b, 18c, and 18d. In one embodiment, temperature sensor 12 senses temperature in proximity of the memory cells such that current and/or voltage pulses generated by write pulse generator 14 are adjusted in accordance with the measured temperature. In applications where memory cell device 10 operates over a temperature range of, for example, 10° C. to 85° C., the heating energy needed to reach a fixed temperature such as the crystallization or melting temperature varies considerably. Consequently, memory cell device 10 may utilize temperature sensor 12 in order to adjust the write pulse current and/or voltage or heating energy used to heat memory cells 18a-18d. In this way, memory cell device 10, using power-adjusted heating pulses, avoids over- or under-heating memory cells 18a-18d.

In one embodiment, memory cell device 10 may comprise a memory chip. Temperature sensor 12 may then be resident on the chip in order to measure chip temperature, taking into account both ambient temperature and heating during chip operation. In this way, the measured temperature via temperature sensor 12 may be used to adjust the amplitude of electrically pulses generated by write pulse generator 14. Write pulse generator 14 may produce electrical pulses used for both the set and reset of memory cells 18a-18d. At lower chip temperatures, the voltage and/or current of the pulses may be increased, whereas the voltage and/or current may be decreased at lower temperatures. In this way, the same target temperature may be reached in the phase-change material of memory cells 18a-18d, independent of the temperature conditions of the chip.

A variety of phase-change materials are known and may be used in accordance with the present invention. Generally, chalcogenide alloys that contain one or more elements from Column IV of the periodic table are useful as such materials. In one embodiment, the phase-change material of memory cells 8a-8d may be made of a chalcogenide compound material, such as GeSbTe or AgInSbTe.

In an alternative embodiment of memory cell device 10, a heater resistor can be placed adjacent memory cells 18a-18b such that current and/or voltage pulses generated by write pulse generator 14 are sent through the adjacent heater resistor, which then causes the phase-change material of memory cells 18a-18d to change temperature appropriately. In this way, memory cell device 10 may still utilize temperature sensor 12 in order to adjust the write pulse current and/or voltage or heating energy used to heat the heater resistors that are adjacent memory cells 18a-18d.

Figure 3:
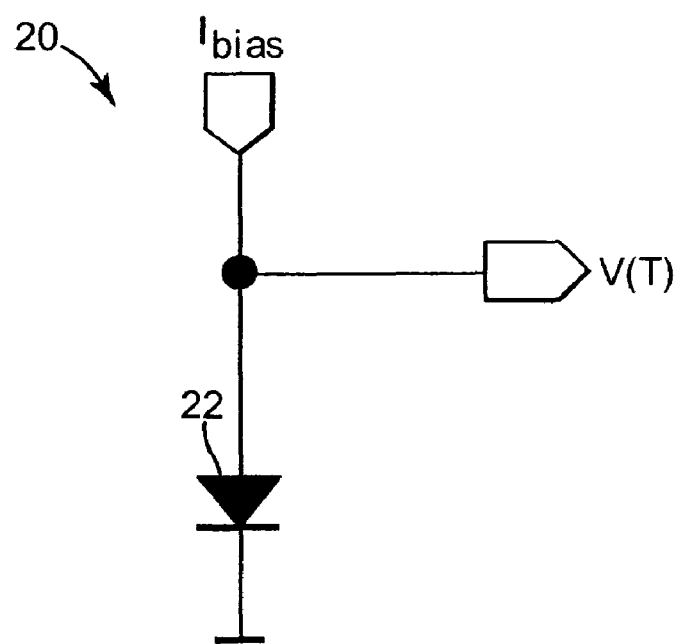
FIG. 3 illustrates one embodiment of a temperature sensor for a memory cell device in accordance with the present invention.

FIG. 3 illustrates one embodiment of a temperature sensor 12 in accordance with the present invention. In this embodiment, a bias current $I_{BIAS}$ is fed into an integrated diode 22. Temperature dependent diode voltage V(T) is the voltage drop across diode 22, which varies with changes in temperature.

Diode 22 may be integrated in a memory chip containing memory cell device 10. One such temperature sensor 20 may be used per memory chip, or several such temperature sensors 20 may be integrated on a single memory chip. For example, a temperature sensor 20 may be used in association with each write pulse generator 14 that is used on a memory chip. In this way, a separate temperature sensor 20 would be used for each write pulse generator 14, each write pulse generator 14 generally producing current pulses for a subset of memory cells on a memory cell device. Such a configuration would accommodate for any temperature variation within a chip when applicable and eliminate the need for additional temperature signal distribution across the chip.

In the embodiment illustrated in FIG. 3, bias current $I_{BIAS}$ is fed into integrated diode 22. Integrated diode 22 is placed in some proximity to the memory cells or other area where temperature is desired to be measured. The voltage drop across diode 22 has a negative temperature coefficient of approximately dVth/dT=−2.3 mV/K. In other words, the temperature dependent diode voltage V(T) varies with changes in sensed temperature, and in one embodiment, diode voltage V(T) decreases approximately 2.3 millivolts per each degree Kelvin of temperature increase. This temperature dependent diode voltage V(T) can be used to adjust the electrical pulses generated by write pulse generator 14 such that appropriate increases and decreases are made to the amplitude of the electrical pulses in accordance with changes in temperature.

The diode voltage V(T) may then be used in a circuit to make adjustments to the electrical pulses that are generated to heat the phase-change material of memory cells. For example, temperature sensor 20 with its temperature dependent diode voltage V(T) may be used in association with memory cell device 10. In this way, write pulse generator 14 may adjust the amplitude of the voltage or current pulses generated therein for distribution to memory cells 18a-18d in accordance with changes in temperature sensed by temperature sensor 12. When the sensed temperature is relatively low, diode voltage V(T) will increase relative to when the sensed temperate is higher and the diode voltage V(T) increases. At lower sensed temperatures, and thus higher diode voltage V(T), the voltage and/or current of the pulses generated by write pulse generator 14 is increased. At higher sensed temperatures, and thus lower diode voltage V(T), the voltage and/or current of the pulses generated by write pulse generator 14 is decreased. In this way, the same target temperature may be reached in the phase-change material of the memory cells independent of the external conditions.

Figure 4:
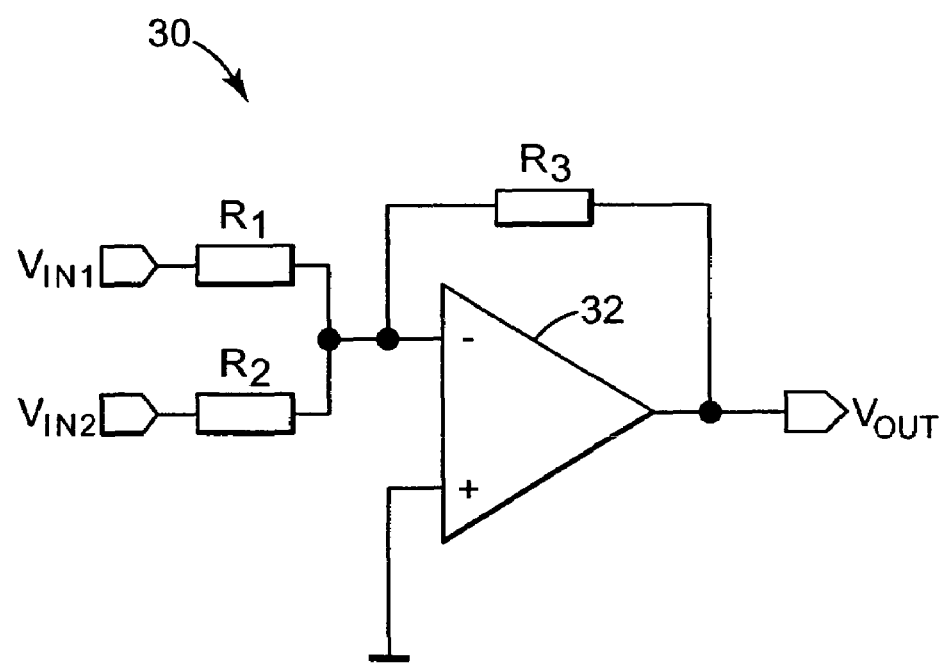
FIG. 4 illustrates one embodiment of a temperature dependent reference voltage circuit for use with a memory cell device in accordance with the present invention.

Such energy adjustment in the pulse signals for the memory cells may be accomplished a variety of ways in accordance with the present invention. For example, FIG. 4 illustrates a voltage adder circuit 30 that may be used as a temperature-dependent reference voltage circuit in conjunction with memory cell device 10. Voltage adder circuit 30 may be used in order to obtain a signal that can be independently tailored in both magnitude and temperature coefficient dV/dT by appropriate choice of feedback resistors.

Voltage adder circuit 30 illustrated in FIG. 4 includes resistors R1, R2, and R3 and operational amplifier (op amp) 32, having a negative input terminal, a positive input terminal and an output terminal. Resistor R3 is coupled between the negative input of op amp 32 and its output. First ends of resistors R1 and R2 are coupled in parallel to the negative input of op amp 32. In one embodiment, a temperature-independent reference voltage $V_{IN}$, is applied to a second end of resistor R1. A temperature-dependent voltage $V_{IN2}$ is coupled to a second end of resistor R2.

In one embodiment, the temperature-independent reference voltage $V_{IN1}$ is constant and does not change over time. In this way, reference voltage $V_{IN1}$ may be described with $dV_{IN1}/dT=0$. Also in one embodiment, diode voltage V(T) (from FIG. 3) is applied as the temperature-dependent voltage $V_{IN2}$. As described above, the temperature-dependent voltage V(T) does change with temperature and may be described with dV(T)/dT=−2.3 mV/K. Given these input voltages to voltage adder circuit 30, the output voltage $V_{OUT}$ on op amp 32 will change with temperature T and may be described as follows:

$$\frac{dV_{OUT}}{dT} = -R_3 \cdot \left( \frac{d}{dT} \frac{V_{REF}}{R_1} + \frac{d}{dT} \frac{V(T)}{R_2} \right) = \frac{R_3}{R_2} \cdot 2.3 \frac{mV}{K} \quad \text{Equation 1}$$

Using this relationship, $V_{OUT}$ can also be described as follows:

$$V_{OUT} = -R_3 \cdot \left( \frac{V_{IN1}}{R_1} + \frac{V_{IN2}}{R_2} \right) \quad \text{Equation 2}$$

The temperature adjusted voltage $V_{OUT}$ can be used directly in the case of voltage pulse writing or as an input signal for the current source in the case of current pulse writing. The temperature adjusted voltage $V_{OUT}$ can be used to adjust electrical pulses in either the case where memory cells are heated by running current directly through the cells or where memory cells are heated by running current through heat resisters adjacent the cells. In an alternative embodiment, not only the pulse amplitude, but also the duration of the signal can be adjusted depending on the sensed temperature.

Memory cell device 10, utilizing temperature sensor 12 and making adjustments to the write pulse accordingly, avoids overheating memory cells at elevated chip temperatures. In this way, lifetime or endurance of the phase change memory cells is increased. In addition, these adjustments lower the risk of material segregation, thereby increasing the device lifetime. Also, memory cell device 10 in accordance with one embodiment of the inventions decreases thermal stress thereby decreasing chances of cracking or delamination of the phase-change material. Furthermore, the average power consumption of the device is decreased since the pulse conditions do not need to be tailored to the worst case. Instead, pulse conditions are tailored to actual case thereby saving energy where the actual case demands less energy than the worst case.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of adjusting a write pulse in a memory cell device, the method comprising:
  sensing the temperature of the memory cell device with a temperature sensing circuit and producing a corresponding temperature-dependant voltage;
  providing a write pulse that is adjusted in accordance with the temperature-dependant voltage; and
  heating a phase-change memory cell within the memory cell device with the write pulse such that the phase-change memory cell changes states.

2. The method of claim 1, wherein the phase-change memory cell includes phase-change material, further including heating the phase-change material in the phase-change memory cell with the write pulse that is adjusted in accordance with the temperature-dependant voltage to a crystallization temperature in order to set the phase-change memory cell.

3. The method of claim 2, further including heating the phase-change material in the phase-change memory cell with the write pulse that is adjusted in accordance with the temperature-dependant voltage to a melting temperature, and then quickly quenching the material, in order to reset the phase-change memory cell.

4. A method of adjusting a write pulse in a memory cell device, the method comprising:
  sensing the temperature of the memory cell device with a temperature sensing circuit and producing a corresponding temperature-dependent voltage;
  providing a write pulse, wherein the voltage and/or current of the write pulse is adjusted in accordance with the temperature-dependent voltage; and
  heating a phase-change memory cell with the memory cell device with the write pulse such that the phase-change memory cell changes states.

5. The method of claim 4 further comprising distributing the provided write pulse to a plurality of phase-change memory cells.

6. The method of claim 5, wherein the plurality of phase-change memory cells each contain phase-change material, wherein a first state of each memory cell is an amorphous state and wherein a second state of each memory cell is a crystalline state.

7. A method of adjusting a write pulse in a memory cell device, the method comprising:
providing a plurality of phase-change memory cells each capable of defining at least a first and a second state;
generating a write pulse capable of changing at least some of the plurality of phase-change memory cells from the first state to the second state and from the second state to the first state;
sensing a temperature; and
adjusting current and/or voltage of the write pulse for at least some of the plurality of phase-change memory cells in accordance with the temperature sensed so that the current and/or voltage of the write pulse signal is appropriate for changing states of the phase-change memory cells.

8. The method of claim 7 further comprising distributing the generated write pulse to at least some of the plurality of phase-change memory cells.

9. The method of claim 8, wherein the plurality of phase-change memory cells each contain phase-change material, wherein the first state of each memory cell is an amorphous state and wherein the second state of each memory cell is a crystalline state.

10. The method of claim 9 further comprising selecting the phase-change material from a group comprising GeSbTe or AgInSbTe, and chalcogenide alloys.

11. The method of claim 9 further comprising directing the write pulse through the phase-change material thereby heating up the material.

12. The method of claim 9 further comprising directing the write pulse through a heat resistor that is adjacent the phase-change material thereby heating up the material.

13. The method of claim 7 further comprising locating the temperature sensor adjacent the plurality of phase-change memory cells such that is senses the temperature adjacent the plurality of phase-change memory cells.

14. The method of claim 7, wherein generating a write pulse further comprises generating a current pulse.

15. The method of claim 7, wherein generating a write pulse further comprises generating a voltage pulse.

16. The method of claim 7, wherein adjusting the current and/or voltage of the write pulse further comprises adjusting the write pulse amplitude in accordance with the temperature sensed by the temperature sensor.

17. The method of claim 7, wherein adjusting the current and/or voltage of the write pulse further comprises adjusting the write pulse length in accordance with the temperature sensed by the temperature sensor.

18. The method of claim 7, wherein adjusting the current and/or voltage of the write pulse further comprises adjusting the write pulse amplitude and the write pulse length in accordance with the temperature sensed by the temperature sensor.

19. The method of claim 7 further comprising integrating the phase-change memory cells, the write pulse generator, and the temperature sensor all in a single chip.

20. The method of claim 7 further comprising configuring the phase-change memory cells in a random access memory device.

* * * * *